(12) United States Patent
Waltz et al.

(10) Patent No.: US 7,606,045 B2
(45) Date of Patent: Oct. 20, 2009

(54) HEAD OR BOTTOM ELEMENT OF A COMPONENT SUPPORT

(75) Inventors: Eike Waltz, Aptos, CA (US); Werner Körber, Betzenstein (DE); Kurt Schaffer, Eckental (DE)

(73) Assignee: RITTAL RES Electronic Systems GmbH & Co. KG, Herborn (DE)

( * ) Notice: Subject to any disclaimer, the term of this patent is extended or adjusted under 35 U.S.C. 154(b) by 315 days.

(21) Appl. No.: 11/262,296

(22) Filed: Oct. 28, 2005

(65) Prior Publication Data

US 2006/0116019 A1 Jun. 1, 2006

(30) Foreign Application Priority Data

Nov. 9, 2004 (DE) .................... 10 2004 054 338

(51) Int. Cl.
*H05K 5/00* (2006.01)
(52) U.S. Cl. .................... 361/756; 361/800; 361/816
(58) Field of Classification Search ............... 361/800, 361/816, 818, 769, 756, 727, 802, 741; 174/35 R, 174/51
See application file for complete search history.

(56) References Cited

U.S. PATENT DOCUMENTS

| | | | | |
|---|---|---|---|---|
| 4,335,819 A | * | 6/1982 | Weisman et al. | 211/41.17 |
| 5,394,305 A | * | 2/1995 | Moral et al. | 361/796 |
| 5,638,259 A | * | 6/1997 | McCarthy et al. | 361/800 |
| 5,892,662 A | * | 4/1999 | Verma | 361/796 |
| 6,285,548 B1 | * | 9/2001 | Hamlet et al. | 361/695 |
| 6,288,902 B1 | * | 9/2001 | Kim et al. | 361/725 |
| 7,006,358 B2 | * | 2/2006 | Liu et al. | 361/752 |
| 7,320,615 B2 | * | 1/2008 | Fang | 439/377 |

FOREIGN PATENT DOCUMENTS

| EP | 1 441 579 A1 | 7/2004 |
|---|---|---|
| WO | WO 00/28799 | 5/2000 |

\* cited by examiner

*Primary Examiner*—Hung S Bui
(74) *Attorney, Agent, or Firm*—Pauley Petersen & Erickson

(57) ABSTRACT

A head or bottom element of a component support, having guide rails arranged side-by-side and aligned in an insertion direction for receiving a printed circuit board of a plug-in module, wherein the guide rails are formed by one-piece guide elements of the head or bottom element. The guide elements can be formed of two rows of several guide strips per guide rail, each of which extends in the insertion direction, which strips are punched out of a plate-shaped head or bottom element and are projectingly beveled in the direction toward an underside of the head element or a top of the bottom element. A distance of the guide strips of the guide rails is matched to the thickness of the printed circuit boards of the plug-in modules. The head or bottom element forms guide paths for the printed circuit boards of the plug-in modules between the rows of guide strips of the guide rails. The production of the head or bottom element is not only simplified, but is also made cheaper, and furthermore the possibility of contacting the head or bottom element with the printed circuit boards is increased.

23 Claims, 4 Drawing Sheets

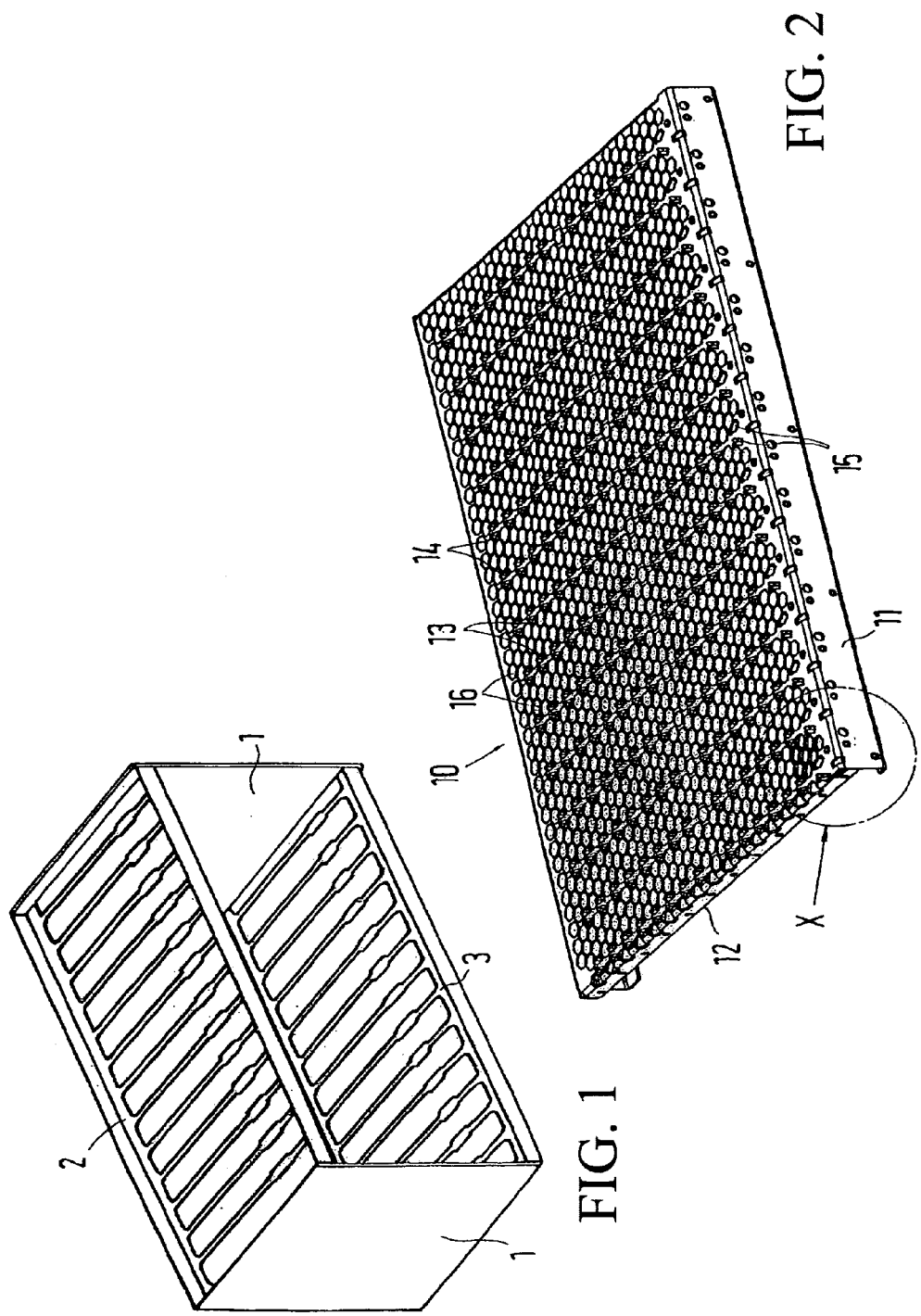

HEAD OR BOTTOM ELEMENT OF A COMPONENT SUPPORT

BACKGROUND OF THE INVENTION

1. Field of the Invention

This invention relates to a head or bottom element of a component support, having guide rails arranged side-by-side and aligned in an insertion direction for receiving a printed circuit board of a plug-in module, wherein the guide rails are formed by one-piece guide elements of the head or bottom element.

2. Discussion of Related Art

A head or bottom element for a component support is known from European Patent Reference EP 1 441 579 A1. Because the guide rails are a part of the head or bottom elements, it is possible to considerably reduce the number of structural elements of the component support. The assembly cost outlay is also reduced. The previously customary insertable separate guide rails, such as are necessary, for example, for a component support in accordance with PCT International Publication WO 00/28799, can be omitted.

One advantage of these head or bottom elements is that with the arrangement of a cooling unit underneath the bottom element, cooling air can pass through the bottom element and can cool the plug-in module.

These advantages of the known head or bottom elements are obtained but at a price associated with a very complicated and expensive manufacture, because the guide rails are of a bottom and two lateral walls and, with the bulges and contact points with the printed circuit boards of the plug-in modules, they can thus not be produced in a simple punching and bending process. Also, these guide rails do not offer a simple solution for providing resilient contact.

SUMMARY OF THE INVENTION

It is one object of this invention to simplify a head or bottom element for a component support of the type mentioned above but in such a way that it can be produced in the form of a simple punched and bent element, by which the insertion of the plug-in modules can be made easier and a resilient contact with the printed circuit boards of the plug-in modules can also be provided in a simple manner.

In accordance with this invention, the above object is accomplished with guide elements formed of two rows of several guide strips per guide rail, each of which extends in the insertion direction. The strips are punched out of a plate-shaped head or bottom element and are projectingly beveled in a direction toward an underside of the head element or the top of the bottom element. The distance of the guide strips of the guide rails is matched to the thickness of the printed circuit boards of the plug-in modules. The head or bottom elements form guide paths for the printed circuit boards of the plug-in modules between the rows of guide strips of the guide rails.

The guide strips as the guide elements can be produced in a simple punching and bending process, from a plate-shaped base element. In this case the guide strips provide no or no great resistance forces, so that the plug-in modules can be easily inserted. Thus, the increase of the distance of the guide strips facing a guide track in the direction of the free end edge is very advantageous. The guide track between the guide strips assures a dependable support and guidance of the printed circuit board.

So that the printed circuit boards do not become hooked during insertion or removal, in one possible embodiment of this invention, it is possible for the distance between the guide strips to be slightly increased in the direction toward the free end edges of the guide strips.

So that ventilation and cooling of the plug-in modules from the direction of the underside can be maintained, in a further embodiment, outside of the guide tracks and guide strips, the head or bottom element is embodied in the manner of a perforated plate by perforations. The perforations are produced in the same punching process together with the guide strips.

If in one embodiment the sides of the plate-like head or bottom elements are stiffened by beveled lateral walls, it is possible to obtain sufficient stability with a reduced wall thickness of the head or bottom element.

If a head and a bottom element with guide rails is provided with the component support, then the cost outlay for the two elements can be further reduced if the head and bottom elements are identically embodied and are installed, rotated by 180°, in the component support.

Particularly good guidance of and contact with the printed circuit board in the guide rails is achieved if the guide elements of the guide tracks are arranged in pairs opposite each other.

In another embodiment, the facing sides of the first pair of guide strips at the insertion side of the guide tracks extend as insertion strips at an acute angle with each other, which opens in the direction of the insertion side. The insertion strips of the guide tracks thus form an insertion receiver having an insertion slope, a sort of forced positioning and introduction into the guide rail is already obtained when placing the plug-in module against the start of a guide rail. This makes equipping the component support easier.

Preferably, the head or bottom element is made of an electrically conductive material, so it can also be used in a simple way for contacting and grounding, or shielding of the plug-in module.

Contacting of the printed circuit board of the plug-in module can be easily achieved if a spring element, which extends with a spring leaf into the guide rail, can be placed on one of the insertion strips. In this case, the slip-on process is simply made easier because the spring element has a slip-on hood matched to the cross section of the insertion element.

Fixing the spring element in place on the insertion strip occurs in such a way that a U-shaped plug element, which has two legs with snap-in flaps, adjoins the slip-on hood of the spring element. The plug element can be snapped into the punched receiver of the head or bottom element being created while punching out and beveling the insertion strip. The snap-in and slip-on process without hooking of the spring element occurs if the plug element terminates in an angled-off end stop, which limits the insertion movement of the plug element and the slip-on movement of the slip-on hood. In this case, the end section of the plug element rests against the underside or top of the head or bottom element, depending on which part the spring element is fixed in place.

The spring leaf extending into the guide rail does not make pulling out the plug-in module more difficult if the spring leaf forms a close contact point with the printed circuit board of the plug-in module, and after the close contact point, the spring leaf transitions into an end section constituting a draw-up slope. The draw-up slope assures that the end section of the spring leaf cannot become hooked at the guide strips.

BRIEF DESCRIPTION OF THE DRAWINGS

This invention is explained in greater detail in view of an exemplary embodiment represented in the drawings, wherein:

FIG. 1 is a perspective plan view of a schematic structure of a known component support;

FIG. 2 is a perspective top view of a bottom element, in accordance with this invention, which can be used for a component group;

DESCRIPTION OF THE PREFERRED EMBODIMENT

Figure 3:
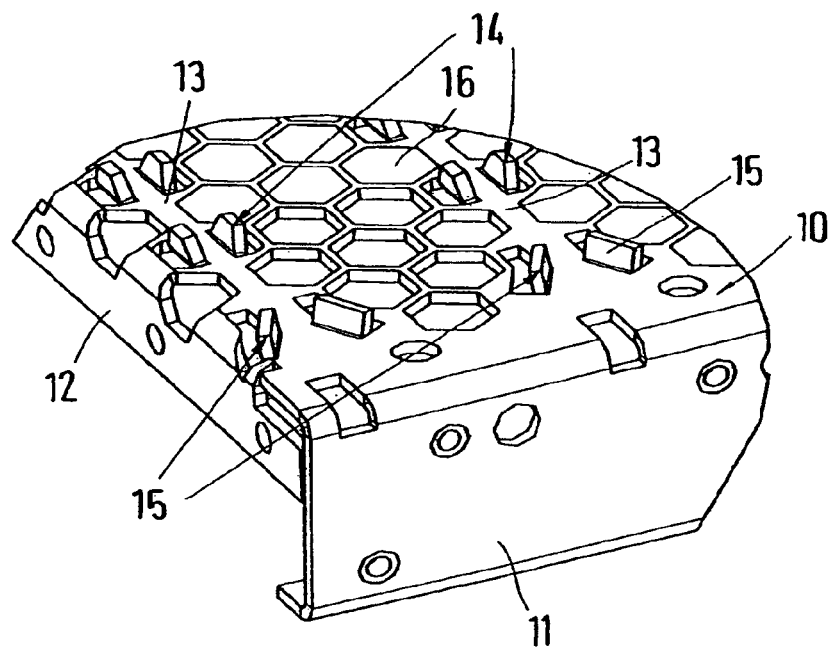
FIG. 3 shows a corner area X of the bottom element in accordance with FIG. 2, in an enlarged perspective view.

The schematic plan view in FIG. 1 shows a component support with two lateral walls 1, which define a width. The head element 2 and the bottom element 3 complete the component support and determine its height. As shown in FIG. 1, the head element 2 and the bottom element 3 are one-piece elements having several guide rails arranged side-by-side and aligned in the insertion direction. A surrounding frame connects the guide rails at the front and the rear of the component support. In this case the head element 2 and the bottom element 3 can be identically designed and inserted into the component support rotated by 180°, wherein the guide rails at the head element 2 are open toward the bottom and at the bottom element 3 open toward the top in order to receive and guide a printed circuit board of a plug-in module. As explained, head or bottom elements embodied in this way cannot be produced simply and cost-effectively because of the structural design of the guide rails.

To avoid this disadvantage, the component support in accordance with this invention uses head or bottom elements 10 in accordance with FIG. 2, which can be produced in a simple uncomplicated process in the form of simple punched and bent elements, because the essential bending processes can also be practically performed only in the punching direction. For reasons of stability, the plate-shaped head or bottom element 10, provided with many perforations, is reinforced by beveled edges as the lateral walls 11 and 12.

Figure 4:
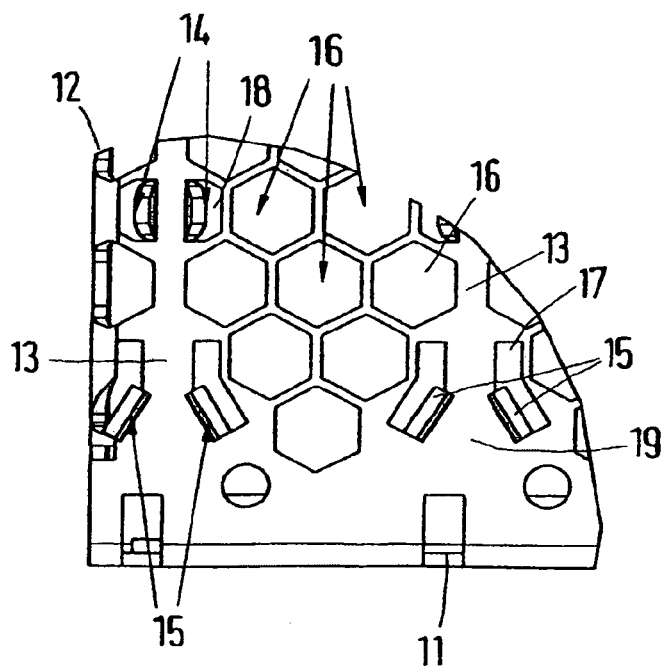
FIG. 4 shows the corner area X in a top view.

As shown in the enlarged plan views in FIGS. 3 and 4, guide tracks 13 with guide strips 14 stood on edge as guide rails are formed, which are aligned from the front to the back of the head or bottom element 10. At the front, a pair of insertion strips 15 forms one insertion receiver per guide rail. Outside of the guide tracks 13, the head or bottom element 10 has perforations 16 to form a perforated plate.

As shown in FIGS. 3 and 4, two rows of guide strips 14 are provided per guide rail, which are simply punched out and stood on edge. In the process, a recess 18 remains next to the guide strip 14. The recesses 16 are regular hexagons and adjoin each other in a honeycomb shape, so that a large part of the surface of the head or bottom element 10 between the closed guide tracks 13 between the two rows of guide strips 14 per guide rail remains open and can be used for the ventilation and/or cooling of the plug-in modules in the component support.

One feature of this invention is clearly visible in FIGS. 3 and 4. The guide strips 14 of the two rows of a guide rail are placed opposite each other in pairs in the insertion direction and are slightly inclined so that the distance from the guide track 13 starting toward the free end of the guide strips 14 increases slightly. In the area of the guide track 13 this distance is matched to the thickness of the printed circuit board of the plug-in module. In this way, friction during insertion of the plug-in module is kept low.

On the insertion side a pair of insertion strips 15 forms an insertion opening as a sort of insertion slope. In addition to their inclination toward their outsides, like the guide strips 14, the pair of insertion strips 15 at the start of the guide rails is punched out obliquely, so that the lateral surfaces facing each other are at an acute angle with respect to each other in the insertion direction. Their distance at each starting front is greater than at the end, so that the narrowing insertion receiver 19 is formed. This insertion receiver 19 transitions at the end into the thickness of the printed circuit board of the plug-in module. The insertion strips 15 are punched out of the head or bottom element 10, wherein the doubled oblique positioning of the insertion strips 15 requires an increased punch receiver 17, as shown in FIG. 4.

Figure 5:
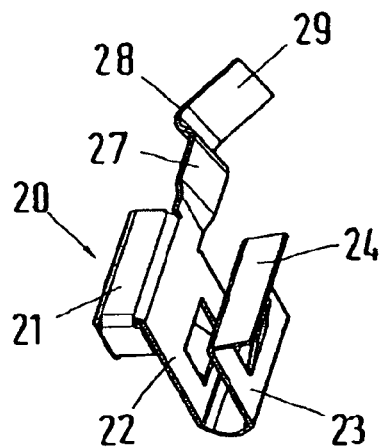
FIG. 5 is a perspective view of a spring element for slipping on an insertion strip of a guide rail.

An example in FIGS. 5 to 9 shows how the head or bottom element 10 with a spring element 20 in accordance with FIG. 5 provides contact between the printed circuit boards of the plug-in modules and the head or bottom elements 10, and how the spring element 20 can be connected with the insertion strip 15 used.

Figure 6:
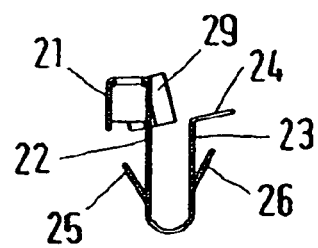
FIG. 6 shows a front view of the spring element in accordance with FIG. 5.
Figure 7:
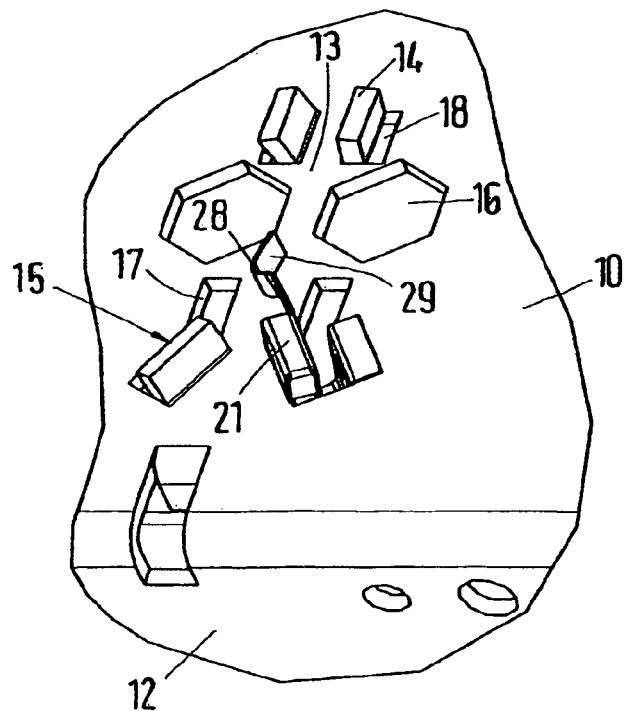
FIG. 7 is a perspective partial view from above of a spring element slipped on an insertion strip and snapped together with the bottom element.
Figure 8:
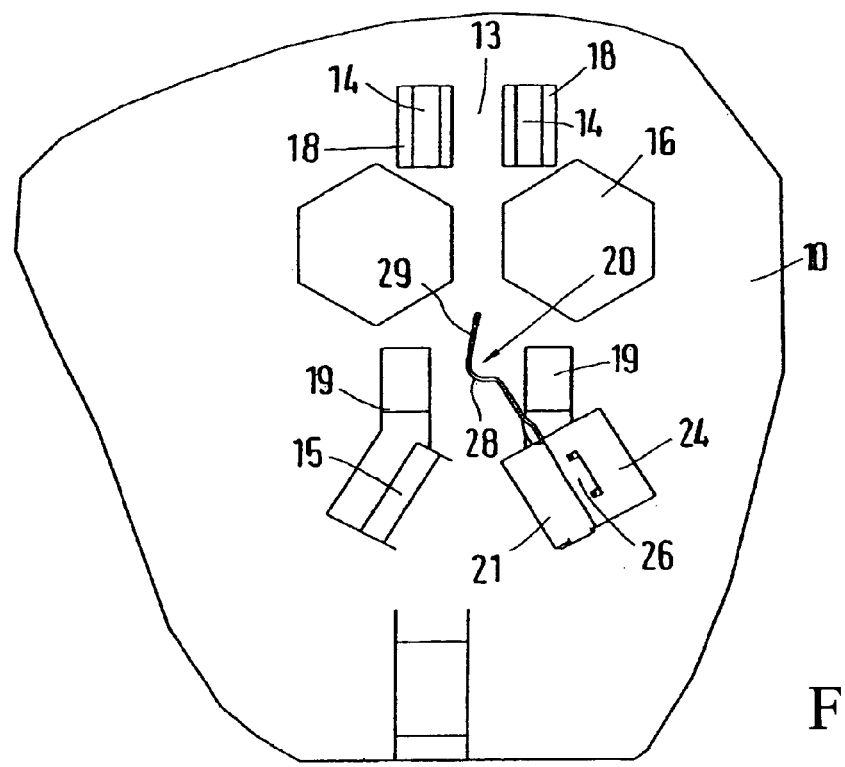
FIG. 8 is a top view of the area of the bottom element represented in FIG. 7.
Figure 9:
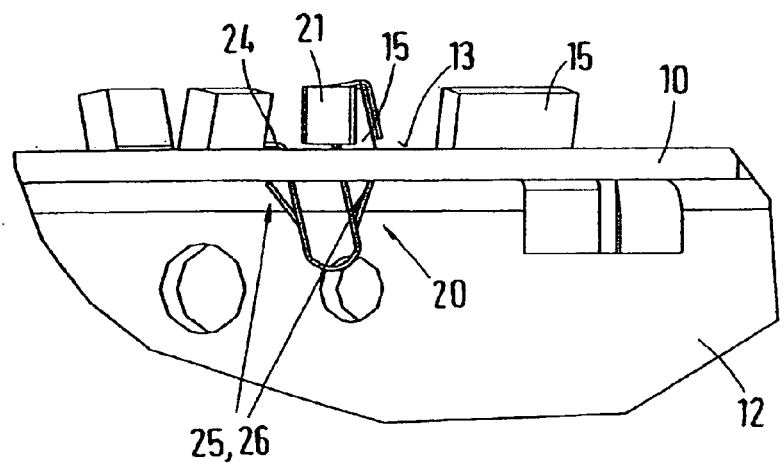
FIG. 9 is a partial plan view with the spring element slipped on an insertion strip and snapped together with the bottom element.

The spring element 20 has a slip-on hood 21, which can be slipped onto the insertion strip 15 of a guide rail. A U-shaped plug element having legs 22 and 23 adjoins the one longitudinal wall of the slip-on hood 21, such as shown in FIG. 6, which snaps into the punch receiver 17 of the insertion strip 15, such as shown in FIG. 9. In the process, the snap-in flaps 25 and 26 punched out of the legs 22 and 23 are supported on the top of the head element, or the underside of the bottom element 10. The end section 25 of the leg 23 limits the slip-on and snap-in movement, so that the spring element 20 is seated solidly and without being tilted on the insertion strip 15. A spring leaf 27 is attached to the slip-on hood 21 of the spring element 20 which, the same as the contact spring, protrudes into the guide rail, as FIGS. 7 and 8 show. Thus a close contact point 28 formed on the spring leaf 27 projects the farthest into the guide rail. If a printed circuit board of a plug-in module is inserted, the spring leaf 27 is deflected and only the close contact point 28 makes the electrical connection. The end section 29 of the spring leaf 27 as a pull-out slope is spaced apart from the printed circuit board so that when pulling out the plug-in module it cannot become hooked thereon. The spring element 20 can be variously embodied, so that it can be attached either on the left or the right insertion strip 15 of a guide rail.

German Patent Reference 10 2004 054338.0-3, the priority document corresponding to this invention, and its teachings are incorporated, by reference, into this specification.

What is claimed is:

1. A head or bottom element of a component support, having guide rails arranged side-by-side and aligned in an insertion direction for receiving a printed circuit board of a plug-in module, wherein the guide rails are formed by guide elements of the head or bottom element, the head or bottom element comprising:

the guide elements formed as two rows of guide strips per said guide rail each of which extends in the insertion direction, each of the two rows formed of a plurality of the guide strips which are punched out of a plate-shaped head or bottom element and projectingly beveled in a direction toward one of an underside of the head element and a top of the bottom element;

a distance of the guide strips of the guide rails matched to a thickness of the printed circuit boards of the plug-in modules; and the head or bottom element forming guide paths for the printed circuit boards of the plug-in modules between the rows of guide strips of the guide rails; and the head or bottom element embodied as a perforated plate outside of the guide paths and the guide strips by perforations, wherein the perforations include a plurality of recesses disposed between adjacent guide rails, each of the plurality of recesses formed as a hexagon and wherein the plurality of recesses form a honeycomb formation in the head or bottom element.

2. The head or bottom element in accordance with claim 1, wherein the distance between the guide strips is slightly increased in a direction toward end edges of the guide strips.

3. The head or bottom element in accordance with claim 2, wherein sides of the head or bottom element which is plate shaped are stiffened by beveled lateral walls.

4. The head or bottom element in accordance with claim 3, wherein the head and bottom element are identically embodied and are installed, rotated by 180°, in the component support.

5. The head or bottom element in accordance with claim 4, wherein the guide strips of the guide tracks are arranged in pairs opposite each other.

6. The head or bottom element in accordance with claim 5, wherein facing sides of a first pair of the guide strips at an insertion side of the guide tracks extend as insertion strips at an acute angle with respect to each other, which opens in the direction of the insertion side, and the insertion strips of the guide tracks have an insertion receiver with an insertion slope.

7. The head or bottom element in accordance with claim 6, wherein the head or bottom element is made of an electrically conductive material and is made as a punched and bent element.

8. The head or bottom element in accordance with claim 7, wherein a spring element is positionable on one of the insertion strips, which extends with a spring leaf into the guide rail.

9. The head or bottom element in accordance with claim 8, wherein the spring element has a slip-on hood matched to a cross section of the insertion element.

10. The head or bottom element in accordance with claim 9, wherein a U-shaped plug element having two legs with snap-in flaps adjoins the slip-on hood of the spring element, and the plug element is snappable into the punched receiver of the head or bottom element formed while punching out and beveling the insertion strip.

11. The head or bottom element in accordance with claim 10, wherein the plug element terminates in an angled-off end stop which limits an insertion movement of the plug element and the slip-on movement of the slip-on hood.

12. The head or bottom element in accordance with claim 11, wherein the spring leaf forms a close contact point with the printed circuit board of the plug-in module, and after the close contact point the spring leaf transitions into an end section forming a draw-up slope.

13. The head or bottom element in accordance with claim 1, wherein sides of the head or bottom element which is plate shaped are stiffened by beveled lateral walls.

14. The head or bottom element in accordance with claim 1, wherein the head and bottom element are identically embodied and are installed, rotated by 180°, in the component support.

15. The head or bottom element in accordance with claim 1, wherein the guide strips of the guide tracks are arranged in pairs opposite each other.

16. The head or bottom element in accordance with claim 1, wherein facing sides of a first pair of the guide strips at an insertion side of the guide tracks extend as insertion strips at an acute angle with respect to each other, which opens in the direction of the insertion side, and the insertion strips of the guide tracks have an insertion receiver with an insertion slope.

17. The head or bottom element in accordance with claim 1, wherein the head or bottom element is made of an electrically conductive material and is made as a punched and bent element.

18. The head or bottom element in accordance with claim 1, wherein a spring element is positionable on one of the insertion strips, which extends with a spring leaf into the guide rail.

19. The head or bottom element in accordance with claim 18, wherein the spring element has a slip-on hood matched to a cross section of the insertion element.

20. The head or bottom element in accordance with claim 19, wherein a U-shaped plug element having two legs with snap-in flaps adjoins the slip-on hood of the spring element, and the plug element is snappable into the punched receiver of the head or bottom element formed while punching out and beveling the insertion strip.

21. The head or bottom element in accordance with claim 20, wherein the plug element terminates in an angled-off end stop which limits an insertion movement of the plug element and the slip-on movement of the slip-on hood.

22. The head or bottom element in accordance with claim 21, wherein the spring leaf forms a close contact point with the printed circuit board of the plug-in module, and after the close contact point the spring leaf transitions into an end section forming a draw-up slope.

23. A head or bottom element of a component support, having guide rails arranged side-by-side and aligned in an insertion direction for receiving a printed circuit board of a plug-in module, the head or bottom element comprising:

each of the guide rails including a guide path for the printed circuit boards of the plug-in modules that extends between guide elements formed of two rows of guide strips each of which extends in the insertion direction, the guide path having a width matched to a thickness of the printed circuit boards of the plug-in modules, and each of the two rows is formed of a plurality of the guide strips which are punched out of the head or bottom element and projectingly beveled in a direction toward an other of the head or the bottom element;

each of the punched out plurality of guide strips forming an adjacent recess in the head or bottom element;

a plurality of ventilation recesses disposed between adjacent guide rails, wherein between each two adjacent guide strips in each of the guide elements is disposed at least a portion of one of the plurality of ventilation recesses, wherein each of the plurality of ventilation recesses is formed as a hexagon and wherein the plurality of recesses form a honeycomb formation in the head or bottom element; and a first pair of the guide strips at a printed circuit board insertion side of the guide path extending as insertion strips at an acute angle with respect to each other to form an insertion receiver which opens in a direction of the insertion side.

\* \* \* \* \*